US008587360B2

(12) United States Patent
Ucciardello et al.

(10) Patent No.: US 8,587,360 B2
(45) Date of Patent: Nov. 19, 2013

(54) LEVEL-SHIFTER CIRCUIT USING LOW-VOLTAGE TRANSISTORS (75) Inventors: Carmelo Ucciardello, Catania (IT); Antonino Conte, Tremestieri (IT); Alfredo Signorello, Tremestieri Etneo Catania (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/435,262

(22) Filed: Mar. 30, 2012

(65) Prior Publication Data

US 2012/0274382 A1 Nov. 1, 2012

(30) Foreign Application Priority Data

Apr. 1, 2011 (IT) ................ TO2011A0293

(51) Int. Cl.
*H03L 5/00* (2006.01)

(52) U.S. Cl.
USPC .......................................... 327/333; 327/536

(58) Field of Classification Search
USPC ................................................. 327/536, 333
See application file for complete search history.

(56) References Cited

U.S. PATENT DOCUMENTS

| | | | | |
|---|---|---|---|---|
| 5,521,547 A * | 5/1996 | Tsukada | ........................ | 327/537 |
| 5,729,155 A * | 3/1998 | Kobatake | ........................ | 326/68 |
| 5,867,042 A | 2/1999 | Briner | | |
| 5,963,061 A * | 10/1999 | Briner | ............................. | 327/55 |
| 6,064,227 A * | 5/2000 | Saito | .............................. | 326/68 |
| 6,525,949 B1 * | 2/2003 | Johnson et al. | ................. | 363/60 |
| 6,933,765 B2 * | 8/2005 | Kanno et al. | .................. | 327/333 |
| 7,046,067 B2 * | 5/2006 | Chung | ........................... | 327/333 |
| 7,071,730 B2 | 7/2006 | Cordoba | | |
| 7,151,400 B2 * | 12/2006 | Chen | ............................ | 327/333 |
| 7,436,241 B2 * | 10/2008 | Chen et al. | .................... | 327/536 |
| 7,580,311 B2 * | 8/2009 | Pesavento | .................... | 365/226 |
| 2006/0291319 A1 | 12/2006 | Pesavento | | |
| 2009/0039942 A1 | 2/2009 | Cook et al. | | |
| 2010/0127752 A1 * | 5/2010 | Fort et al. | ....................... | 327/333 |
| 2011/0063012 A1 * | 3/2011 | Chan et al. | ..................... | 327/333 |
| 2012/0019303 A1 * | 1/2012 | Singh | ............................ | 327/333 |

* cited by examiner

*Primary Examiner* — Thomas J. Hiltunen
(74) *Attorney, Agent, or Firm* — Allen, Dyer, Doppelt, Milbrath & Gilchrist, P.A.

(57) ABSTRACT

A level-shifter circuit may include a pair of inputs which receive a first and a second low-voltage phase signal having a first voltage dynamic with a first maximum value. The level-shifter circuit may also include a pair of outputs which supply a first high-voltage phase signal and a second high-voltage phase signal, level-shifted with respect to the low-voltage signals and having a second voltage dynamic with a second maximum value, higher than the first maximum value. The level-shifter circuit may further include transfer transistors coupled between one of a first reference terminal and a second reference terminal, which are set at one of a first reference voltage and a second reference voltage, and the first output or second output. Protection elements may be coupled to a respective transfer transistor to protect from overvoltages between at least one of the corresponding conduction terminals and control terminals.

16 Claims, 5 Drawing Sheets

LEVEL-SHIFTER CIRCUIT USING LOW-VOLTAGE TRANSISTORS

FIELD OF THE INVENTION

The present invention is related to the field of level-shifter circuits using low-voltage transistors.

BACKGROUND OF THE INVENTION

As is known, level-shifter circuits have an extensive application in electronics, for example, in the cases where it may be desirable to interface two integrated circuits operating at different voltage levels. In storage devices, for example of a flash type with 90-nm CMOS technology, an internal supply voltage is present (the so-called "logic supply voltage Vdd", with values, for example, between 1 V and 1.35 V). Moreover, to allow modifying (for programming or erasure) and reading the contents of memory cells, higher operating voltages may be used, with values, for example, between 1.6 V and 10 V. Given the different range of voltage values in these storage devices, it may be desirable to use level-shifter circuits, which enable the two, low-voltage and high-voltage, circuits to be interfaced and set in communication in such a way as to reduce damage and breakdown.

Level-shifter circuits of a known type are generally made with high-voltage transistors (i.e., ones able to operate with high voltage values without any breakdown of the corresponding junction oxides). In some cases, level-shifter circuits may be made with a mix of high-voltage transistors and low-voltage transistors (i.e., ones able to operate without risking breakdown for voltage values not higher than a given threshold voltage, typically corresponding to the logic supply voltage Vdd). In general, these circuits have an important limitation in that they typically do not enable high-frequency switchings, as may, instead, be desired, for example, in phase-generator circuits of a charge pump (which operate, for example, at clock frequencies of from 50 MHz up to even 150 MHz).

As is known, charge-pump circuits are widely used to obtain output voltage values higher than a given input voltage (operating basically as DC-DC boost converters), exploiting the use of capacitors as charge-accumulation elements, to which suitable timing signals, or phase signals are supplied (switching periodically between a low voltage value and a high voltage value). For example, charge-pump circuits are used in flash-memory devices for generating the high voltage values for carrying out the operations of reading, writing, and erasure of data, starting from the low values of the internal supply voltage.

Figure 1:
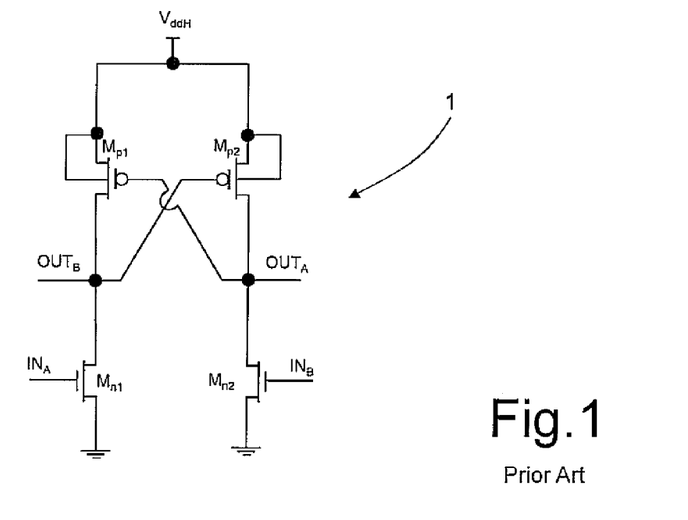
FIG. 1 is a schematic diagram of a level-shifter circuit in accordance with the prior art.

FIG. 1 illustrates a level-shifter circuit 1 of a known type, which uses only high-voltage transistors and is designed to shift a low input voltage operating in the range [0; Vdd] into a high output voltage operating in the range [0; VddH], where VddH is a high, or level-shifted, voltage, higher than the logic supply voltage Vdd. In detail, the level-shifter circuit 1 includes a first transfer transistor $M_{n1}$, of a high-voltage NMOS type (i.e., with thick gate oxide in such a way as to reduce any breakdown at high voltage values), which is connected between a first reference terminal (set at ground potential, Gnd) and an output terminal OutB, and the gate terminal of which is connected to a first input terminal InA receiving a first phase signal FX. The level-shifter 1 includes a second transfer transistor $M_{n2}$, of a high-voltage NMOS type, which is connected between the first reference terminal set at ground potential and a further output terminal OutA, and the gate terminal of which is connected to a second input terminal InB receiving a second phase signal FN. A third transfer transistor $M_{p1}$, of a high-voltage PMOS type, is connected between a second reference terminal (set at the high voltage VddH) and the output terminal OutB, and the gate terminal of which is connected to the output terminal OutA. The level-shifter 1 further includes a fourth transfer transistor $M_{p2}$, of a high-voltage PMOS type, which is connected between the second reference terminal (set at the high voltage VddH) and the output terminal OutA, and the gate terminal of which is connected to the output terminal OutB (it should hence be noted that the third and fourth transfer transistors $M_{p1}$, $M_{p2}$ are connected in latch configuration). It should moreover be noted that, for the purposes of operation of the level-shifter circuit 1, the distinction between the conduction terminals (drain and source terminals) of the various MOS transistors is typically not important.

The first and second phase signals FX, FN are generated starting from the logic supply voltage Vdd and have complementary values (or values negated with respect to one another). In other words, when the first phase signal FX is at a high value equal to Vdd, the second phase signal FN is at a low value equal to Gnd, and vice versa, when the first phase signal FX is equal to Gnd, the second phase signal FN is, instead, at the high value equal to Vdd. In use, when the first phase signal FX is high (and the second phase signal FN is low), the first transfer transistor $M_{n1}$ is on, whereas the second transfer transistor $M_{n2}$ is off. Consequently, the output terminal OutB goes to ground Gnd (through switching-on of the first transfer transistor $M_{n1}$), whereas the second output terminal OutA goes to VddH (through switching-on of the fourth transfer transistor $M_{p2}$), thus switching off the third transfer transistor $M_{p1}$.

The behavior of the circuit is similar when the first phase signal FX is low (Gnd) and the second phase signal FN is high (Vdd). The desired level-shifting effect is thus obtained, with the phase signals FX, FN, received at the inputs InA, InB, that switch in the range that goes from Gnd up to Vdd, and the output signals, supplied on the outputs OutA and OutB, that switch in the range shifted upwards that goes from Gnd up to VddH.

U.S. Pat. No. 7,071,730 discloses a variant embodiment of the level-shifter circuit of FIG. 1, designed to render the switchings thereof faster, using a mixed approach, with both high-voltage transistors and low-voltage transistors.

These mixed-approach circuits are, however, unable to switch at high frequency (for example, at a frequency sufficient for generation of the phases in a charge-pump circuit). Moreover, these circuits entail a considerable current consumption linked to crossover currents.

SUMMARY OF THE INVENTION

The object of the present invention is to provide a level-shifter circuit that addresses the problems highlighted previously, in particular, with respect to the switching frequency of circuits of a known type. According to the present invention, a level-shifter circuit may include a first input configured to receive a first low-voltage phase signal, and may have a first voltage dynamic with a first value. The level-shifter circuit may also include a second input configured to receive a second low-voltage phase signal, complementary with respect to the first phase signal, and may have the first voltage dynamic. A first output may be configured to supply a first high-voltage phase signal, level-shifted with respect to the first low-voltage phase signal and may have a second voltage dynamic with a second value higher than the first value. A second output may be to supply a second high-voltage phase signal, level-shifted with respect to the second low-voltage phase signal and may have the second voltage dynamic.

The level-shifter circuit may also include a first transfer transistor coupled between a first reference terminal at a first reference voltage, and the second output, and may have a control terminal configured to receive the first low-voltage phase signal. The level-shifter circuit may further include a second transfer transistor coupled between the first reference terminal and the first output, and may have a control terminal configured to receive the second low-voltage phase signal. A third transfer transistor may be coupled between a second reference terminal at a second reference voltage may have a value equal to the second value, and the second output. A fourth transfer transistor may be coupled between the second reference terminal and the first output.

A plurality of protection elements each may be coupled to a respective one of the first, second, third, and fourth transfer transistors, and may be configured to provide overvoltage protection between at least one of corresponding current-conduction terminals and control terminals. The plurality of protection elements may include a plurality of protection transistors coupled in a cascode configuration to the respective one of the first, second, third, and fourth transfer transistors. The first, second, third, and fourth transfer transistors, and the plurality of protection transistors may be configured to sustain voltages between at least one of the corresponding current-conduction terminals and control terminals less than or equal to the first value.

The second value may be less than or equal to twice the first value. The plurality of protection transistors may include a first protection transistor coupled between the first transfer transistor and the second output, and may have a control terminal set at a voltage equal to the first value. The plurality of protection transistors may also include a second protection transistor coupled between the second transfer transistor and the first output, and may have a control terminal set at the voltage equal to the first value. A third protection transistor may be coupled between the third transfer transistor and the second output, and may have a control terminal set at a biasing voltage, and a fourth protection transistor may be coupled between the fourth transfer transistor and the first output, and may have a control terminal set at the biasing voltage.

The level-shifting circuit may further include a control stage configured to supply a respective first control signal and second control signal to the control terminals of the third transfer transistor and the fourth transfer transistor. The level-shifting circuit may also include a biasing stage configured to supply the biasing voltage to the control terminals of the third and the fourth protection transistors. The biasing voltage may have a value based upon the values of the control signals on the control terminals of the third and the fourth transfer transistors.

The third and fourth transfer transistors, and the third and fourth protection transistors may include comprise p-channel metal oxide semiconductor (MOS) transistors. The biasing stage may be configured to supply the biasing voltage having a substantially constant value during an entire period of operation, equal to a minimum of the values of the control signals present on the control terminals of the third and the fourth transfer transistors.

The control stage may include a first biasing capacitor coupled to the control terminal of the third transfer transistor and configured to receive the first low-voltage phase signal, and a second biasing capacitor coupled to the control terminal of the fourth transfer transistor and configured to receive the second low-voltage phase signal. The control stage may further include a first control transistor coupled between the control terminal of the third transfer transistor and the second reference terminal, and may have a respective control terminal coupled to the control terminal of the fourth transfer transistor. The control stage may further include a second control transistor coupled between the control terminal of the fourth transfer transistor and the second reference terminal, and may have a respective control terminal coupled to the control terminal of the third transfer transistor.

In some embodiments, the control stage may include a first biasing capacitor coupled to the control terminal of the third transfer transistor and may be configured to receive a first shifted phase signal having a given time shift with respect to the first low-voltage phase signal. The control stage may also include a second biasing capacitor coupled to the control terminal of the fourth transfer transistor and may be configured to receive a second shifted phase signal may have having the given time shift with respect to the second low-voltage phase signal. The control stage may also include a first control transistor coupled between the control terminal of the third transfer transistor and the second reference terminal, and may have a respective control terminal coupled to the control terminal of the fourth transfer transistor. Still further the control stage may include a second control transistor coupled between the control terminal of the fourth transfer transistor and the second reference terminal, and may have a respective control terminal connected to the control terminal of the third transfer transistor.

The biasing stage may include an output node, a first internal node, and a first buffer capacitor coupled to the first internal node and configured to receive the second low-voltage phase signal. The biasing stage may also include a second internal node, and a second buffer capacitor coupled to the second internal node and may be configured to receive the first low-voltage phase signal. The biasing stage may further include a first biasing transistor coupled between the first internal node and the output node, and may have a respective control terminal coupled to the second internal node. The biasing stage also may include a second biasing transistor coupled between the second internal node and the output node, and may have a respective control terminal coupled to the first internal node, and a third biasing transistor having a first conduction terminal configured to receive the first control signal and a second conduction terminal coupled to the output node, and may have a respective control terminal coupled to the first internal node. A fourth biasing transistor may have a first conduction terminal configured to receive the second control signal and a second conduction terminal coupled to the output node, and may have a respective control terminal coupled to the second internal node. The first, second, third, and fourth transfer transistors may include n-channel MOS transistors.

Another aspect is directed to charge-pump circuit that may include the above-noted level-shifter circuit. A method aspect is directed to a method of making a level-shifter circuit.

DETAILED DESCRIPTION OF THE PREFERRED EMBODIMENTS

For a better understanding of the present invention, preferred embodiments thereof are now described, purely by way of non-limiting example, with reference to the attached drawings. The present embodiments stem from the fact that the Applicant has realized that the limits of switching speed of a level-shifter circuit may be exceeded if only low-voltage transistors are used in the circuit, which, having a lower threshold voltage, are able to switch at a higher speed. It would thus be possible to operate at high clock frequencies and considerably reduce the consumption linked to the crossover current.

Figure 2:
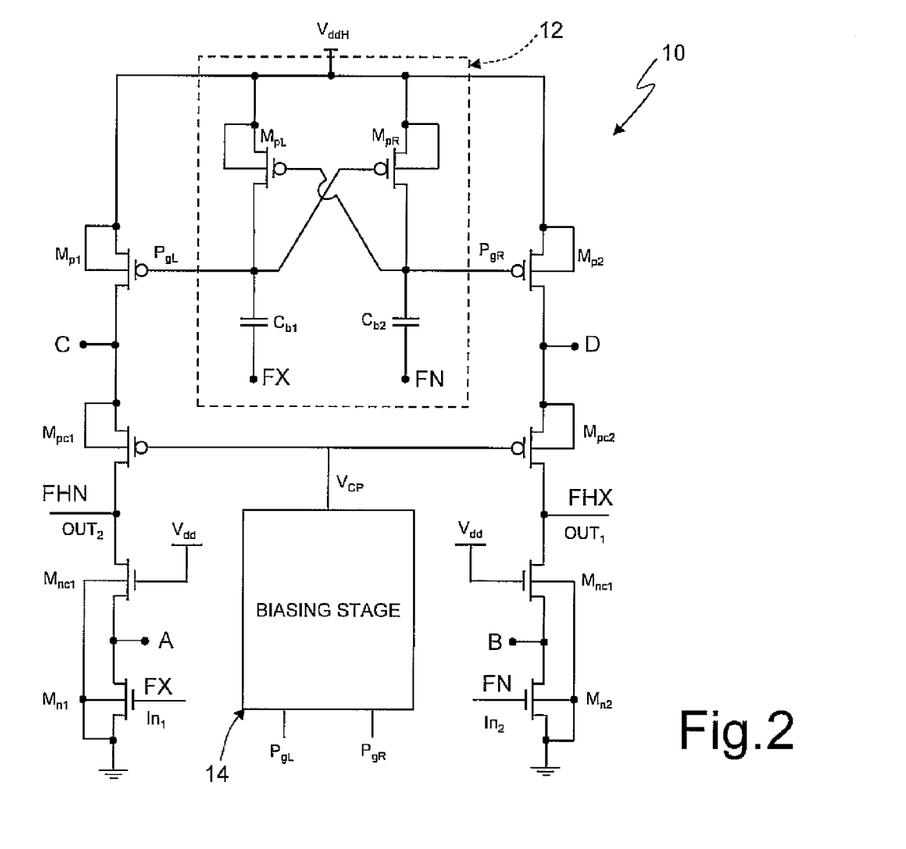
FIG. 2 is a schematic diagram of a level-shifter circuit according to an embodiment of the present invention.

FIG. 2 shows a level-shifter circuit 10, according to one embodiment, configured to enable use only of low-voltage transistors, while reducing the risks of a breakdown of the corresponding oxides (which, being thin, could in fact be easily damaged by the high voltages present in the same circuit). More particularly, the level-shifter circuit 10 includes a first transfer transistor $M_{n1}$, of a low-voltage NMOS type (i.e., able to withstand, without any breakdown, voltages not higher than a given threshold voltage, for example, equal to the logic supply voltage Vdd), which is connected between a first reference terminal (set at ground potential Gnd) and a first internal node A of the level-shifter circuit 10. The gate terminal of the first transfer transistor $M_{n1}$ is connected to a first input terminal In1, receiving a first low-voltage phase signal FX, switching at a given clock frequency from a low value (for example equal to Gnd) to a high value (for example equal to Vdd) in a periodic way.

The level-shifter circuit 10 also includes a second transfer transistor $M_{n2}$, of a low-voltage NMOS type, which is connected between the first reference terminal set at ground potential and a second internal node B, and the gate terminal of which is connected to a second input terminal In2 receiving a second low-voltage phase signal FN, complementary to the first low-voltage phase signal FX. A third transfer transistor $M_{p1}$, of a low-voltage PMOS type, is connected between a second reference terminal (set at a high voltage VddH, having values higher than the logic supply voltage Vdd) and a third internal node C. A gate terminal of the third transfer transistor $M_{p1}$ receives a first control signal $P_{gL}$.

The level-shifter circuit 10 also includes a fourth transfer transistor $M_{p2}$, of a low-voltage PMOS type, which is connected between the second reference terminal receiving the high voltage VddH and a fourth internal node D, and has its gate terminal receiving a second control signal $P_{gR}$. It should once again be noted that, for the purposes of operation of the level-shifter circuit 10, the distinction between drain and source terminals of the various MOS transistors is not important so that they can be referred to generically as "current-conduction terminals".

According to one aspect of the present embodiment, the level-shifter circuit 10 further comprises appropriate protection elements, connected to a respective transfer transistor $M_{n1}$, $M_{n2}$, $M_{p1}$, $M_{p2}$, in a "cascode" configuration (i.e., cascaded and traversed, in use, by the same current). These protection elements prevent or reduce overvoltages on the corresponding transfer transistors, so as to prevent or reduce breakdown or damage thereto.

In detail, a first protection transistor $M_{nc1}$, of a low-voltage NMOS type, is connected between the first internal node A and a second output terminal Out2, present on which is, in use, a second high-voltage phase signal FHN. The first protection transistor $M_{nc1}$ has a gate terminal that receives the logic supply voltage Vdd. A second protection transistor $M_{nc2}$ of a low-voltage NMOS type, is connected between the second internal node B and a first output terminal Out1, present on which is, in use, a first high-voltage phase signal FHX. The second protection transistor $M_{nc1}$ has a gate terminal that receives the logic supply voltage Vdd. A third protection transistor $M_{pc1}$, of a low-voltage PMOS type, is connected between the third internal node C and the second output terminal Out2, and has a gate terminal that receives a biasing voltage $V_{cp}$, of an appropriate value. A fourth protection transistor $M_{pc2}$, of a low-voltage PMOS type, is connected between the fourth internal node D and the first output terminal Out1, and has a gate terminal that receives the same biasing voltage $V_{cp}$.

The level-shifter circuit 10 further comprises a control stage 12, configured to generate the control signals $P_{gL}$, $P_{gR}$ for the gate terminals of the transfer transistors $M_{p1}$, $M_{p2}$. The control stage 12 receives, at the input, the voltage VddH and the low-voltage phase signals FX, FN (operating in the low-voltage range, or logic voltage, comprised between 0 V, or ground, and Vdd, for example, with values in the range between 1 V and 1.35 V), and supplies at the output the aforesaid control signals $P_{gR}$, $P_{gL}$.

In greater detail, the control stage 12 comprises a first biasing capacitor $C_{b1}$, which has a first terminal receiving the first low-voltage phase signal FX and a second terminal connected to the gate terminal of the third transfer transistor $M_{p1}$ and supplies the first control signal $P_{gL}$. The control stage 12 also includes a second biasing capacitor $C_{b2}$, which has a first terminal receiving the second low-voltage phase signal FN and a second terminal connected to the gate terminal of the fourth transfer transistor $M_{p2}$ and supplies the second control signal $P_{gR}$. A first control transistor $M_{pL}$, of a low-voltage PMOS type, is connected between the second reference terminal set at the high voltage VddH and the second terminal of the first biasing capacitor $C_{b1}$, and has its gate terminal connected to the second terminal of the second biasing capacitor $C_{b2}$. A second control transistor $M_{pR}$, of a low-voltage PMOS type, is connected between the second reference terminal set at the high voltage VddH and the second terminal of the second biasing capacitor $C_{b2}$, and has its gate terminal connected to the second terminal of the first biasing capacitor $C_{b1}$ (the first and second control transistors $M_{pL}$, $M_{pR}$ are thus connected in latch configuration).

During operation of the control stage 12, when the first low-voltage phase signal FX is high (Vdd) and the second low-voltage phase signal FN is low (Gnd), the first control transistor $M_{pL}$ is on, whereas the second control transistor $M_{pR}$ is off. The first control signal $P_{gL}$ goes to the value of the high voltage VddH, whereas the second control signal $P_{gR}$, which was at the value of the high voltage VddH in the previous half-period of the clock signal, drops by a value equal to the logic supply voltage Vdd, to assume the value of (VddH−Vdd).

The control stage 12 behaves in a similar way in the next half-period of the clock signal, when the first low-voltage phase signal FX switches to the low value (Gnd) and the second low-voltage phase signal FN switches to the high value (Vdd). It follows that the control signals $P_{gL}$ and $P_{gR}$ are each time opposite to one another (or complementary to one another), and their range of values goes from (VddH−Vdd), low value, to VddH, high value.

The level-shifter circuit 10 further comprises a biasing stage 14, configured (as will be described more fully hereinafter) to generate the biasing voltage $V_{cp}$ with a constant value (throughout the period of the clock signal), equal to the minimum voltage that can be assumed by the first and second control signals $P_{gL}$, $P_{gr}$, which, on basis of the previous discussion, is, in particular, equal to (VddH−Vdd). Intuitively, this choice of the value of the biasing voltage $V_{cp}$ enables effective switching-on/switching-off of the protection transistors (of a PMOS type) $M_{pc1}$, $M_{pc2}$, i.e., issuing of a command to these transistors for complete switching-on/complete switching-off.

General operation of the level-shifter circuit 10 is now described. When the first low-voltage phase signal FX is high (Vdd) and the second low-voltage phase signal FN is low (Gnd), the first control signal $P_{gL}$ is brought to VddH, whereas the second control signal $P_{gR}$ is at (VddH−Vdd). In this condition, moreover, the first transfer transistor $M_{n1}$ is on, whereas the third transfer transistor $M_{p1}$ is off, in such a way that the second high-voltage phase signal FHN is brought to Gnd (note that the first protection transistor $M_{nc1}$ is on, having its gate terminal at Vdd). In the same half-period of the clock signal, the second transfer transistor $M_{nc2}$ is off, whereas the fourth transfer transistor $M_{p2}$ is on, so that the first high-voltage phase signal FHX is brought to VddH (note that the fourth protection transistor $M_{pc2}$ is on, based upon the appropriate value of the biasing voltage $V_{cp}$).

When, instead, the first low-voltage phase signal FX is low (Gnd) and the second low-voltage phase signal FN is high (Vdd), the first control signal $P_{gL}$, is brought to (VddH−Vdd) and the second control signal $P_{gR}$ is at VddH, thus obtaining that the second high-voltage phase signal FHN is at VddH and the first high-voltage phase signal FHX is at Gnd (obtaining in this way the desired operation of level shifting between the low-voltage phase signals FX, FN and the corresponding high-voltage phase signals FHX, FHN).

Some considerations are now made on the maximum values of the voltages present within the level-shifter circuit 10, in particular, to define the maximum value of the high supply voltage VddH, at which the same circuit can be operated without breakdown of the MOS transistors (by way of example, reference may be made, for these considerations, to the left branch of the level-shifter circuit 10, referred to the second output terminal Out2, but altogether similar considerations apply to the right branch of the same circuit). When the first low-voltage phase signal FX is at Gnd and the second high-voltage phase signal FHN is at VddH, the first transfer transistor $M_{n1}$ is off, whereas the third transfer transistor $M_{p1}$ is on.

It may be readily appreciated that the only transistor that presents possible critical aspects, owing to the presence of possible overvoltages across its terminals, is the first protection transistor $M_{nc1}$. The drain terminal of this transistor is in fact at VddH, the gate terminal is at Vdd, whereas the source terminal is at (Vdd−Vth), where Vth is the threshold voltage of the same transistor.

For the voltage on the gate oxide (i.e., the difference of potential between the drain and gate terminals) not to exceed Vdd (given the low-voltage nature of the transistor), it may be sufficient to impose that $$VddH-Vdd \leq Vdd$$

where the condition to be satisfied by the value of the high supply voltage is obtained:

$$VddH \leq 2 \cdot Vdd.$$

Likewise, in the case where the first high-voltage phase signal FHN is at Gnd, it may readily be appreciated that it be desirable to impose that the voltage on the oxide of the third protection transistor $M_{pc1}$ does not exceed Vdd. This implies that $$(V_{CP}-FHN) \leq Vdd$$

where $$(VddH-Vdd) \leq Vdd$$

and hence the following condition is to be satisfied:

$$VddH \leq 2 \cdot Vdd$$

i.e., that the high supply voltage VddH should not exceed twice the value of the logic supply voltage Vdd.

For example, in the case where the minimum value of the logic supply voltage Vdd is equal to 1 V, it may be sufficient that the high voltage VddH does not exceed the value of 2 V to incur increased risks of breakdown of the oxides of the low-voltage MOS transistors used in the level-shifter circuit 10.

Figure 3:
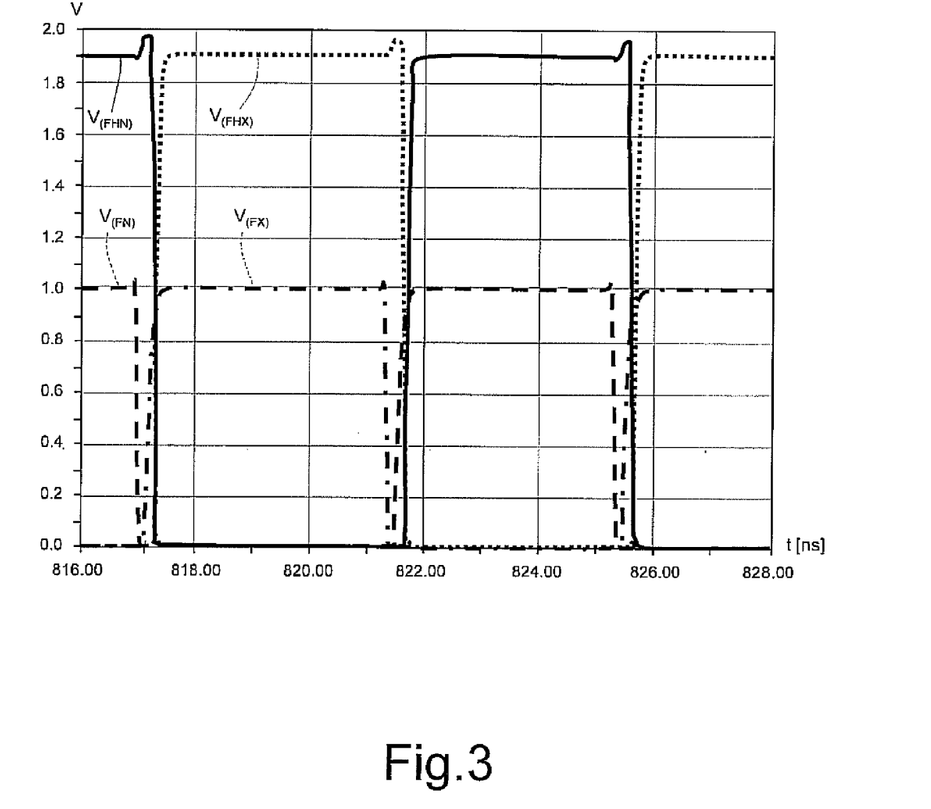
FIG. 3 is a graph of phase signals within the circuit of FIG. 2.

FIG. 3 show the plots of the low-voltage and high-voltage phase signals, referred to the aforesaid example. It may be noted, in particular, that the low-voltage phase signals FX, FN have a periodic (square) waveform with a range of variability [0; 1 V], while the high-voltage phase signals FHX, FHN have a similar periodic (square) waveform, with a range of variability [0; 1.9 V]. It may be moreover noted that the switching frequency obtained in the level-shifter circuit 10 exceeds 120 MHz.

Figure 4:
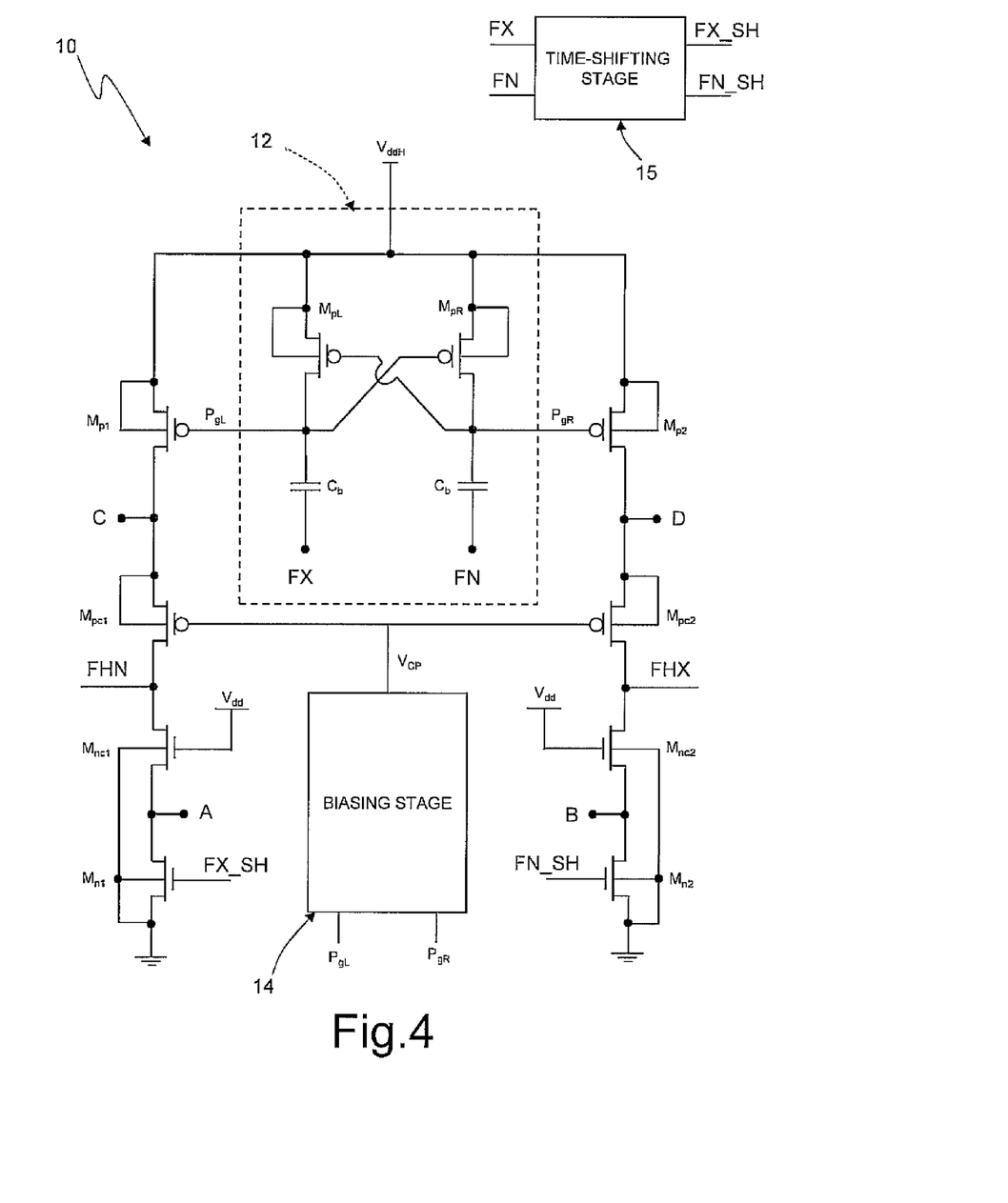
FIG. 4 is a schematic diagram of a level-shifter circuit according to another embodiment of the present invention.

FIG. 4 shows a variant embodiment of the level-shifter circuit 10, in which, to further reduce the crossover current, time shifted phase signals FX_SH, FN_SH are sent to the first and second transfer transistors $M_{n1}$, $M_{n2}$, delayed or advanced with respect to the low-voltage phase signals FX and FN being supplied to the control stage 12. In particular, the time shift is such that the current path between VddH and Gnd does not present, during switching, the four transistors in each branch (right branch or left branch of the circuit) simultaneously on.

Figure 5:
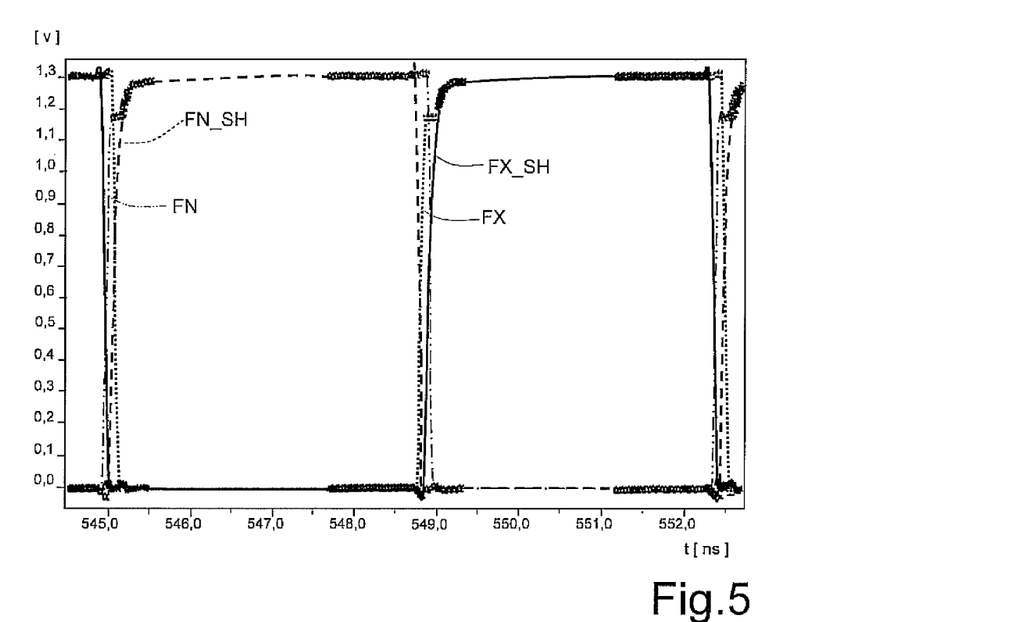
FIG. 5 is a graph of phase signals within the circuit of FIG. 4.

As shown schematically in FIG. 4, the level-shifter circuit 10 comprises a time-shifting stage 15, which receives at input the low-voltage phase signals FX, FN, and generates at output, for the control stage 12, the shifted phase signals FX_SH, FN_SH, having an appropriate time shift with respect to the corresponding low-voltage phase signals FX, FN. FIG. 5 shows an example of the plots of the low-voltage phase signals FX and FN, and of the corresponding shifted phase signals FX_SH, FN_SH in the level-shifter circuit 10 of FIG. 4.

Figure 6:
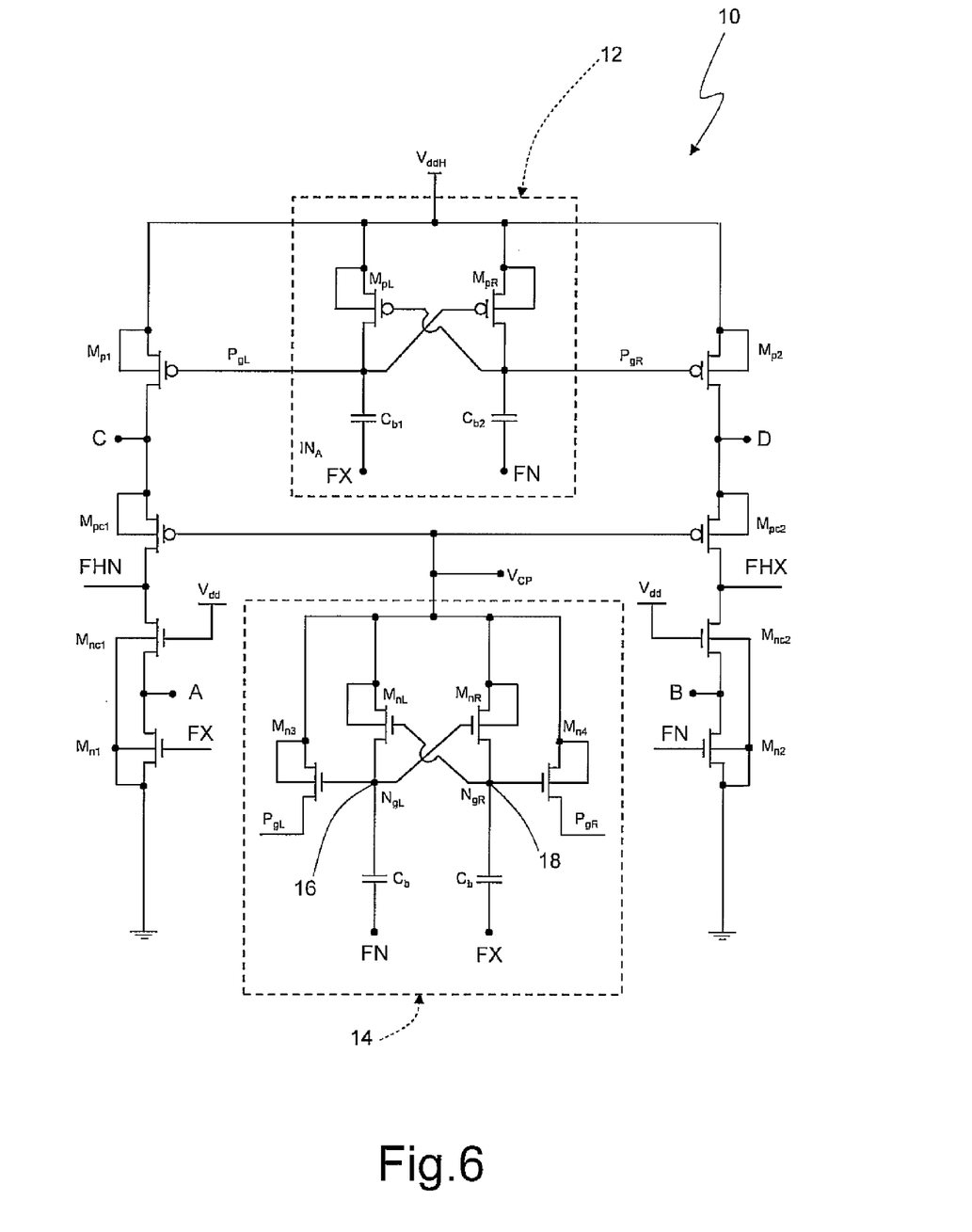
FIG. 6 is a more detailed schematic diagram of the level-shifter circuit according to the present invention.

With reference to FIG. 6, a description of a possible circuit implementation of the biasing stage 14 is now presented, for generation of the biasing voltage $V_{cp}$ having an appropriate value (as discussed previously). In detail, the biasing stage 14 comprises a first buffer capacitor $C_b$, which receives on a first terminal the second low-voltage phase signal FN and has the second terminal connected to a node 16, which is internal to the biasing stage 14 and present on which is a third control signal $N_{gL}$. The biasing stage 14 also includes a second buffer capacitor $C_b$, which receives on a first terminal the first low-voltage phase signal FX and has the second terminal connected to a node 18, which is internal to the biasing stage 14 and present on which is a fourth control signal $N_{gR}$.

The biasing stage 14 further comprises a first biasing transistor $M_{nL}$, of a low-voltage NMOS type, which has a first current-conduction terminal connected to the output of the biasing stage 14 and set at the biasing voltage $V_{cp}$ and a second current-conduction terminal connected to the node 16. The first biasing transistor $M_{nL}$ has its control terminal (or gate terminal) connected to the node 18. The biasing stage 14 further includes a second biasing transistor $N_{nR}$, of a low-voltage NMOS type, which has a first current-conduction terminal set at the biasing voltage $V_{cp}$ and a second current-conduction terminal connected to the node 18, and has its control terminal (or gate terminal) connected to the node 16 (note that the first and second biasing transistors $M_{nL}$, $M_{nR}$ are thus connected in latch configuration). A third biasing transistor $M_{n3}$, of a low-voltage NMOS type, has a first current-conduction terminal supplying the biasing voltage $V_{cp}$, and a second current-conduction terminal receiving the first control signal $P_{gL}$, and also has its control terminal (or gate terminal) connected to the node 16. A fourth biasing transistor $M_{n4}$, of a low-voltage NMOS type, has a first current-conduction terminal supplying the biasing voltage $V_{cp}$, and a second current-conduction terminal receiving the first control signal $P_{gR}$, and also has its control terminal (or gate terminal) connected to the node 18.

Operation of the biasing stage 14 is such that the biasing voltage $V_{cp}$ is constant throughout the operating period of the level-shifter circuit 10, and in particular equal to the minimum voltage of the control signals $P_{gL}$ and $P_{gR}$. In detail, in a first half-period of the clock signal, the following conditions arise (note that "ON" and "OFF" indicate, respectively, the conditions of switching-on and switching-off of the associated transistors):

$FX=0\ V;\ FN=Vdd$ $M_{pL} \rightarrow OFF;\ M_{pR} \rightarrow ON$ $P_{gL}=(VddH-Vdd);\ P_{gR}=VddH$ In the same half-period of the clock signal, the following further conditions arise:

$M_{nL} \rightarrow OFF;\ M_{nR} \rightarrow ON$ $N_{gL}=(V_{cp}+Vdd);\ N_{gR}=V_{cp}$ and moreover:

$M_{n3} \rightarrow ON;\ M_{n4} \rightarrow OFF$ $V_{cp}=P_{gL}=(VddH-Vdd)$

In addition, in a second half-period of the clock signal, the following conditions arise:

$FX=Vdd;\ FN=0\ V$ $M_{pL} \rightarrow ON;\ M_{pR} \rightarrow OFF$ $P_{gL}=VddH;\ P_{gR}=(VddH-Vdd)$ In the same half-period of the clock signal, the following further conditions arise:

$M_{nL} \rightarrow ON;\ M_{nR} \rightarrow OFF$ $N_{gL}=V_{cp};\ N_{gR}=(V_{cp}+Vdd)$ and moreover:

$M^{n3} \rightarrow OFF;\ M_{n4} \rightarrow ON$ $V_{cp}=P_{gR}=(VddH-Vdd)$

The biasing voltage $V_{cp}$, as desired, is hence constantly equal to VddH−Vdd, throughout the period of operation of the level-shifter circuit 10.

Basically, the circuit configuration of the biasing stage 14 is such as to exploit the same low-voltage phase signals FX, FN as those sent to the control stage 12 for governing opening and closing of the biasing transistors $M_{n3}$, $M_{n4}$ and consequent transfer to the output of the lower between the signals $P_{gL}$, $P_{gR}$ received at the input. Moreover, the further biasing transistors $M_{nL}$, $M_{nR}$ are exploited for connecting, alternately, the biasing capacitors $C_b$ to the output of the biasing stage 14 to recover the charge lost in the previous half-period for driving the biasing transistors $M_{n3}$, $M_{n4}$.

The nodes 16, 18 are thus typically always at voltage values such as to open/close in an effective and complete manner the transistors the gate terminals of which are connected to the nodes themselves. For example, a high voltage on the node 16 enables, at the same time, closing of the biasing transistors $M_{n3}$ and $M_{nR}$, and hence both transfer of the signal $P_{gL}$ towards the output and updating of the biasing capacitor $C_b$ belonging to the node 18 at the same output voltage. Instead, the biasing transistors $M_{n4}$ and $M_{nL}$ in the same half-period are open, given the complementarity of the low-voltage phase signals FX, FN.

Figure 7:
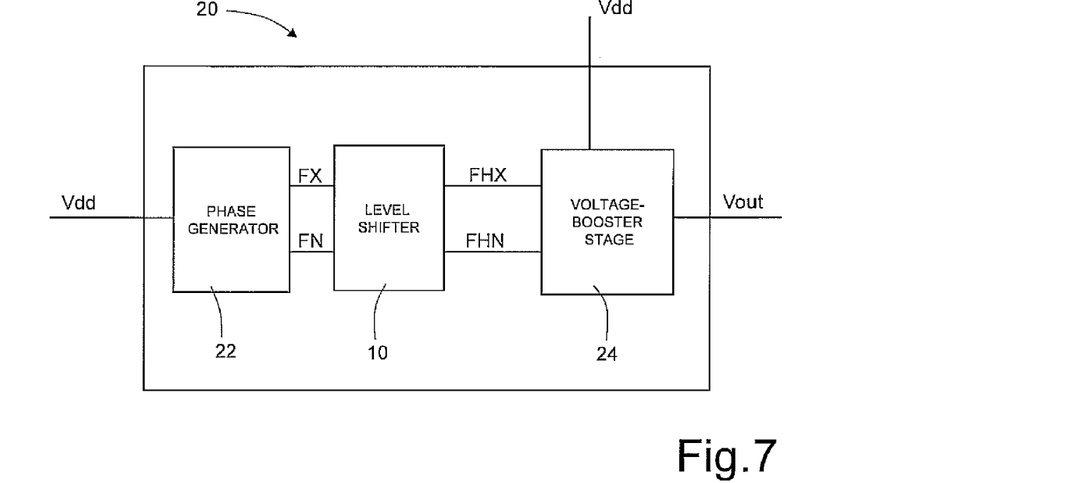
FIG. 7 is a schematic block diagram of a charge-pump circuit including the level-shifter circuit of FIG. 2.

FIG. 7 shows a block diagram of a charge-pump circuit 20, in which the level-shifter circuit 10 can be used with function of high-voltage phase generator. The charge-pump circuit 20 comprises a low-voltage phase generator stage 22, which receives the logic supply voltage Vdd, and generates the low-voltage phase signals FX, FN. The charge pump circuit 20 also includes the level-shifter circuit 10, which receives the low-voltage phase signals FX, FN and generates, by the level-shifting operation described previously in detail, the high-voltage phase signals FHX, FHN. A booster stage 24, which receives the logic supply voltage Vdd and supplies at output a boosted voltage Vout, supplies, in an appropriate and alternating way, in the successive half-periods of the clock signal, the high-voltage phase signals FHX, FHN to appropriate pump-capacitor elements (as is known and for this reason is not described in detail herein).

The advantages of the level-shifter circuit according to the present embodiments are clear from the foregoing description. In any case, it is once again emphasized that use in the circuit of just low-voltage transistors allows operation at high switching frequencies (even up to more than 120 MHz). The particular circuit arrangement reduces possible breakdown of the low-voltage transistors, using appropriate elements for protection from overvoltages (which cause the voltages on the oxides of the transistors not to exceed a sustainable critical threshold).

The level-shifter circuit 10 is hence particularly advantageous, for example, for use in charge-pump circuits, for generation of high-voltage phase signals, where high clock frequencies are desired to reduce the size of the pump capacitors and hence the occupied area. The circuit described moreover enables considerable reduction in the consumption of electric current, enabling reduction of the crossover currents.

Finally, it is clear that modifications and variations may be made to what is described and illustrated herein, without thereby departing from the scope of the present invention, as defined in the appended claims. In particular, it is evident that the level-shifter circuit finds advantageous, though not exclusive, application within a charge-pump circuit, for generation of the phase signals necessary for the boosting operation of the circuit (which in turn can advantageously be used in a storage device, for generating the high voltages for the programming and reading operations). Other uses can be equally envisaged in all those cases where it is desirable to interface two circuit portions operating at different voltage levels.

Moreover, it is evident that circuit modifications may be envisaged, which do not alter the general operating principle of the circuit. For example, the biasing stage 14 may have a different circuit configuration, which will enable in any case generation of the desired value for the biasing voltage $V_{cp}$.

That which is claimed:

1. A level-shifter circuit comprising:
   a first input configured to receive a first low-voltage phase signal, and having a first voltage dynamic with a first value;
   a second input configured to receive a second low-voltage phase signal, complementary with respect to the first low-voltage phase signal, and having the first voltage dynamic;
   a first output configured to supply a first high-voltage phase signal, level-shifted with respect to the first low-voltage phase signal and having a second voltage dynamic with a second value higher than the first value;
   a second output configured to supply a second high-voltage phase signal, level-shifted with respect to the second low-voltage phase signal and having the second voltage dynamic;
   a first transfer transistor coupled between a first reference terminal at a first reference voltage, and the second output, and having a control terminal configured to receive the first low-voltage phase signal;
   a second transfer transistor coupled between the first reference terminal and the first output, and having a control terminal configured to receive the second low-voltage phase signal;
   a third transfer transistor coupled between a second reference terminal at a second reference voltage having a value equal to the second value, and the second output;
   a fourth transfer transistor coupled between the second reference terminal and the first output;
   a plurality of protection transistors coupled in a cascode configuration and each coupled to a respective one of said first, second, third, and fourth transfer transistors, and configured to provide overvoltage protection between at least one of corresponding current-conduction terminals and control terminals, said plurality of protection transistors comprising
      a first protection transistor coupled between said first transfer transistor and the second output, and having a control terminal set at a voltage equal to the first value,
      a second protection transistor coupled between said second transfer transistor and the first output, and having a control terminal set at the voltage equal to the first value,
      a third protection transistor coupled between said third transfer transistor and the second output, and having a control terminal set at a biasing voltage, and
      a fourth protection transistor coupled between said fourth transfer transistor and the first output, and having a control terminal set at the biasing voltage;
   a control stage configured to supply a respective first control signal and second control signal to the control terminals of said third transfer transistor and said fourth transfer transistor; and
   a biasing stage configured to supply the biasing voltage to the control terminals of said third and said fourth protection transistors, the biasing voltage having a value based upon the values of the control signals on the control terminals of said third and said fourth transfer transistors.

2. The circuit according to claim 1, wherein said first, second, third, and fourth transfer transistors, and said plurality of protection transistors are configured to sustain voltages between at least one of the corresponding current-conduction terminals and control terminals less than or equal to the first value.

3. The circuit according to claim 1, wherein the first output comprises the first output having a second value associated therewith less than or equal to twice the first value.

4. The circuit according to claim 1, wherein said third and said fourth transfer transistors, and said third and said fourth protection transistors comprise p-channel metal oxide semiconductor (MOS) transistors; and wherein said biasing stage is configured to supply the biasing voltage having a substantially constant value during a period of operation, equal to a minimum of the values of the control signals present on the control terminals of said third and said fourth transfer transistors.

5. The circuit according to claim 1, wherein said control stage comprises:
   a first biasing capacitor coupled to the control terminal of said third transfer transistor and configured to receive the first low-voltage phase signal;
   a second biasing capacitor coupled to the control terminal of said fourth transfer transistor and configured to receive the second low-voltage phase signal;
   a first control transistor coupled between the control terminal of said third transfer transistor and the second reference terminal, and having a respective control terminal coupled to the control terminal of said fourth transfer transistor; and
   a second control transistor coupled between the control terminal of said fourth transfer transistor and the second reference terminal, and having a respective control terminal coupled to the control terminal of said third transfer transistor.

6. The circuit according to claim 1, wherein said control stage comprises:
   a first biasing capacitor coupled to the control terminal of said third transfer transistor and configured to receive a first shifted phase signal having a given time shift with respect to the first low-voltage phase signal;
   a second biasing capacitor coupled to the control terminal of said fourth transfer transistor and configured to receive a second shifted phase signal having the given time shift with respect to the second low-voltage phase signal;
   a first control transistor coupled between the control terminal of said third transfer transistor and the second reference terminal, and having a respective control terminal coupled to the control terminal of said fourth transfer transistor; and
   a second control transistor coupled between the control terminal of said fourth transfer transistor and the second reference terminal, and having a respective control terminal connected to the control terminal of said third transfer transistor.

7. The circuit according to claim 1, wherein said biasing stage comprises:
   an output node;
   a first internal node;
   a first buffer capacitor coupled to the first internal node and configured to receive the second low-voltage phase signal;
   a second internal node;
   a second buffer capacitor coupled to the second internal node and configured to receive the first low-voltage phase signal;

a first biasing transistor coupled between the first internal node and the output node, and having a respective control terminal coupled to the second internal node;

a second biasing transistor coupled between the second internal node and the output node, and having a respective control terminal coupled to the first internal node;

a third biasing transistor having a first conduction terminal configured to receive the first control signal and a second conduction terminal coupled to the output node, and having a respective control terminal coupled to the first internal node; and a fourth biasing transistor having a first conduction terminal configured to receive the second control signal and a second conduction terminal coupled to the output node, and having a respective control terminal coupled to the second internal node.

8. The circuit according to claim 1, wherein said first transfer transistor, said second transfer transistor, said first protection transistor, and said second protection transistor comprise n-channel MOS transistors.

9. A charge-pump circuit comprising:

a voltage booster stage; and a level-shifter circuit coupled to said voltage booster stage and comprising
- a first input configured to receive a first low-voltage phase signal, and having a first voltage dynamic with a first value,
- a second input configured to receive a second low-voltage phase signal, complementary with respect to the first low-voltage phase signal, and having the first voltage dynamic,
- a first output configured to supply a first high-voltage phase signal, level-shifted with respect to the first low-voltage phase signal and having a second voltage dynamic with a second value higher than the first value,
- a second output configured to supply a second high-voltage phase signal, level-shifted with respect to the second low-voltage phase signal and having the second voltage dynamic,
- a first transfer transistor coupled between a first reference terminal at a first reference voltage, and the second output, and having a control terminal configured to receive the first low-voltage phase signal,
- a second transfer transistor coupled between the first reference terminal and the first output, and having a control terminal configured to receive the second low-voltage phase signal,
- a third transfer transistor coupled between a second reference terminal at a second reference voltage having a value equal to the second value, and the second output,
- a fourth transfer transistor coupled between the second reference terminal and the first output, and
- a plurality of protection transistors coupled in a cascode configuration, and each coupled to a respective one of said first, second, third, and fourth transfer transistors, and configured to provide overvoltage protection between at least one of corresponding current-conduction terminals and control terminals, said plurality of protection transistors comprising
  - a first protection transistor coupled between said first transfer transistor and the second output, and having a control terminal set at a voltage equal to the first value,
  - a second protection transistor coupled between said second transfer transistor and the first output, and having a control terminal set at the voltage equal to the first value,
  - a third protection transistor coupled between said third transfer transistor and the second output, and having a control terminal set at a biasing voltage, and
  - a fourth protection transistor coupled between said fourth transfer transistor and the first output, and having a control terminal set at the biasing voltage,
- a control stage configured to supply a respective first control signal and second control signal to the control terminals of said third transfer transistor and said fourth transfer transistor, and
- a biasing stage configured to supply the biasing voltage to the control terminals of said third and said fourth protection transistors, the biasing voltage having a value based upon the values of the control signals on the control terminals of said third and said fourth transfer transistors.

10. The charge-pump circuit according to claim 9, wherein said first, second, third, and fourth transfer transistors, and said plurality of protection transistors are configured to sustain voltages between at least one of the corresponding current-conduction terminals and control terminals less than or equal to the first value.

11. The charge-pump circuit according to claim 9, wherein the first output comprises the first output having a second value associated therewith less than or equal to twice the first value.

12. The charge-pump circuit according to claim 9, wherein said third and said fourth transfer transistors, and said third and said fourth protection transistors comprise p-channel metal oxide semiconductor (MOS) transistors; and wherein said biasing stage is configured to supply the biasing voltage having a substantially constant value during a period of operation, equal to a minimum of the values of the control signals present on the control terminals of said third and said fourth transfer transistors.

13. The charge-pump circuit according to claim 9, wherein said control stage comprises:

a first biasing capacitor coupled to the control terminal of said third transfer transistor and configured to receive the first low-voltage phase signal;

a second biasing capacitor coupled to the control terminal of said fourth transfer transistor and configured to receive the second low-voltage phase signal;

a first control transistor coupled between the control terminal of said third transfer transistor and the second reference terminal, and having a respective control terminal coupled to the control terminal of said fourth transfer transistor; and a second control transistor coupled between the control terminal of said fourth transfer transistor and the second reference terminal, and having a respective control terminal coupled to the control terminal of said third transfer transistor.

14. The charge-pump circuit according to claim 9, wherein said control stage comprises:

a first biasing capacitor coupled to the control terminal of said third transfer transistor and configured to receive a first shifted phase signal having a given time shift with respect to the first low-voltage phase signal;

a second biasing capacitor coupled to the control terminal of said fourth transfer transistor and configured to receive a second shifted phase signal having the given time shift with respect to the second low-voltage phase signal;
a first control transistor coupled between the control terminal of said third transfer transistor and the second reference terminal, and having a respective control terminal coupled to the control terminal of said fourth transfer transistor; and
a second control transistor coupled between the control terminal of said fourth transfer transistor and the second reference terminal, and having a respective control terminal connected to the control terminal of said third transfer transistor.

15. The charge-pump circuit according to claim 9, wherein said biasing stage comprises:
an output node;
a first internal node;
a first buffer capacitor coupled to the first internal node and configured to receive the second low-voltage phase signal;
a second internal node;
a second buffer capacitor coupled to the second internal node and configured to receive the first low-voltage phase signal;
a first biasing transistor coupled between the first internal node and the output node, and having a respective control terminal coupled to the second internal node;
a second biasing transistor coupled between the second internal node and the output node, and having a respective control terminal coupled to the first internal node;
a third biasing transistor having a first conduction terminal configured to receive the first control signal and a second conduction terminal coupled to the output node, and having a respective control terminal coupled to the first internal node; and
a fourth biasing transistor having a first conduction terminal configured to receive the second control signal and a second conduction terminal coupled to the output node, and having a respective control terminal coupled to the second internal node.

16. A method of making a level-shifter circuit comprising:
configuring a first input to receive a first low-voltage phase signal, and to have a first voltage dynamic with a first value;
configuring a second input to receive a second low-voltage phase signal, complementary with respect to the first low-voltage phase signal, and to have the first voltage dynamic;
configuring a first output to supply a first high-voltage phase signal, level-shifted with respect to the first low-voltage signal and to have a second voltage dynamic with a second value higher than the first value;
configuring a second output to supply a second high-voltage phase signal, level-shifted with respect to the second low-voltage signal and to have the second voltage dynamic;
coupling a first transfer transistor between a first reference terminal, at a first reference voltage, and the second output, and to have a control terminal configured to receive the first low-voltage phase signal;
coupling a second transfer transistor between the first reference terminal and the first output, and to have a control terminal configured to receive the second low-voltage phase signal;
coupling a third transfer transistor between a second reference terminal at a second reference voltage having a value equal to the second value, and the second output;
coupling a fourth transfer transistor between the second reference terminal and the first output; and
coupling each of a plurality of protection transistors in a cascode configuration, to a respective one of said first, second, third, and fourth transfer transistors, and to provide overvoltage protection between at least one of corresponding current-conduction terminals and control terminals, coupling the plurality of protection transistors comprising
coupling a first protection transistor between said first transfer transistor and the second output, and to have a control terminal set at a voltage equal to the first value,
coupling a second protection transistor between said second transfer transistor and the first output, and to have a control terminal set at the voltage equal to the first value,
coupling a third protection transistor between said third transfer transistor and the second output, and to have a control terminal set at a biasing voltage, and
coupling a fourth protection transistor between said fourth transfer transistor and the first output, and to have a control terminal set at the biasing voltage;
configuring a control stage to supply a respective first control signal and second control signal to the control terminals of the third transfer transistor and the fourth transfer transistor; and
configuring a biasing stage to supply the biasing voltage to the control terminals of the third and the fourth protection transistors, the biasing voltage having a value based upon the values of the control signals on the control terminals of the third and the fourth transfer transistors.

* * * * *